United States Patent
Chandran et al.

(10) Patent No.: US 7,506,654 B2
(45) Date of Patent: *Mar. 24, 2009

(54) ACCELERATED PLASMA CLEAN

(75) Inventors: Shankar N. Chandran, Milpitas (IN); Scott Hendrickson, San Jose, CA (US); Gwendolyn D. Jones, Sunnyvale, CA (US); Shankar Venkataraman, Santa Clara, CA (US); Ellie Yieh, Millbrae, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/968,420

(22) Filed: Oct. 18, 2004

(65) Prior Publication Data

US 2005/0103266 A1 May 19, 2005

Related U.S. Application Data

(62) Division of application No. 10/115,665, filed on Apr. 2, 2002, now Pat. No. 6,814,087, which is a division of application No. 09/246,036, filed on Feb. 4, 1999, now Pat. No. 6,374,831.

(51) Int. Cl.
  *B08B 7/04* (2006.01)
  *B08B 7/00* (2006.01)
(52) U.S. Cl. .............. 134/1.1; 134/1; 134/22.1; 134/22.18; 134/902; 438/905
(58) Field of Classification Search ............ 134/1, 134/1.1, 22.1, 22.18, 902; 438/905
  See application file for complete search history.

(56) References Cited

U.S. PATENT DOCUMENTS

| 4,138,306 A | 2/1979 | Niwa |
| 4,563,367 A | 1/1986 | Sherman |
| 4,851,630 A | 7/1989 | Smith |
| 4,866,346 A | 9/1989 | Gaudreau et al. |
| 4,910,042 A | 3/1990 | Hokynar |
| 4,913,929 A | 4/1990 | Moslehi et al. |

(Continued)

FOREIGN PATENT DOCUMENTS

DE  4132559  4/1993

(Continued)

OTHER PUBLICATIONS

Partial translation of JP 06-124673.*
A. Grill, "Cold Plasma in Material Fabrication," *IEEE Press*, pp. 109-110 and 160-163 (1994).

*Primary Examiner*—Alexander Markoff
(74) *Attorney, Agent, or Firm*—Townsend and Townsend and Crew

(57) ABSTRACT

A method and apparatus that reduces the time required to clean a processing chamber employing a reactive plasma cleaning process. A plasma is formed in an Astron fluorine source generator from a flow of substantially pure inert-source gas. After formation of the plasma, a flow of a fluorine source gas is introduced therein such that the fluorine source flow accelerates at a rate no greater than 1.67 standard cubic centimeters per second$^2$ (scc/s$^2$). In this fashion, the plasma contains a plurality of radicals and dissociated inert-source gas atoms, defining a cleaning mixture. The ratio of inert-source gas to fluorine source is greater than 1:1.

13 Claims, 11 Drawing Sheets

U.S. PATENT DOCUMENTS

| | | | |
|---|---|---|---|
| 4,988,644 A | 1/1991 | Jucha et al. |
| 5,000,113 A | 3/1991 | Wang et al. |
| 5,158,644 A | 10/1992 | Cheung et al. |
| 5,281,302 A | 1/1994 | Gabric et al. |
| 5,346,579 A | 9/1994 | Cook et al. |
| 5,350,480 A | 9/1994 | Gray |
| 5,356,478 A | 10/1994 | Chen et al. |
| 5,403,434 A | 4/1995 | Moslehi |
| 5,501,740 A | 3/1996 | Besen et al. |
| 5,517,943 A | 5/1996 | Takahashi |
| 5,556,475 A | 9/1996 | Besen et al. |
| 5,607,515 A | 3/1997 | Takahashi |
| 5,620,526 A | 4/1997 | Watatani et al. |
| 5,647,953 A | 7/1997 | Williams et al. |
| 5,662,770 A | 9/1997 | Donohoe |
| 5,688,357 A | 11/1997 | Hanawa |
| 5,756,400 A | 5/1998 | Ye et al. |
| 5,770,098 A | 6/1998 | Araki et al. |
| 5,788,778 A | 8/1998 | Shang et al. |
| 5,792,272 A | 8/1998 | van Os et al. |
| 5,812,403 A | 9/1998 | Fong et al. |
| 5,844,195 A | 12/1998 | Fairbairn et al. |
| 5,942,804 A | 8/1999 | Mohwinkel et al. |
| 6,039,834 A | 3/2000 | Tanaka et al. |
| 6,060,400 A | 5/2000 | Oehrlein et al. |
| 6,109,206 A | 8/2000 | Maydan et al. |
| 6,125,859 A | 10/2000 | Kao et al. |
| 6,148,832 A | 11/2000 | Gilmer et al. |
| 6,170,428 B1 | 1/2001 | Redeker et al. |
| 6,182,602 B1 | 2/2001 | Redeker et al. |
| 6,217,951 B1 | 4/2001 | Mizuno et al. |
| 6,274,058 B1 | 8/2001 | Rajagopalan et al. |
| 6,329,297 B1 | 12/2001 | Balish et al. |
| 6,374,831 B1 | 4/2002 | Chandran et al. |
| 6,387,207 B1 | 5/2002 | Janakiraman et al. |
| 6,814,087 B2 * | 11/2004 | Chandran et al. ............ 134/1.1 |

FOREIGN PATENT DOCUMENTS

| | | |
|---|---|---|
| EP | 0537950 | 4/1993 |
| EP | 0552491 | 7/1993 |
| EP | 0 697 467 A1 | 2/1996 |
| EP | 1 118 692 A1 | 7/2001 |
| JP | 1-220434 | 9/1989 |
| JP | 2-125876 | 5/1990 |
| WO | WO 97/03223 | 1/1997 |
| WO | WO 99/02754 | 1/1999 |
| WO | WO 99/03312 | 1/1999 |

* cited by examiner

ACCELERATED PLASMA CLEAN

CROSS-REFERENCES TO RELATED APPLICATIONS

This application is a division of U.S. application Ser. No. 10/115,665, filed Apr. 2, 2002, entitled "Accelerated Plasma Clean," having Shankar N. Chandran, Scott Hendrickson, Gwendolyn D. Jones, Shankar Venkataraman and Ellie Yieh listed as coinventors; which is a division of U.S. application Ser. No. 09/246,036, filed Feb. 4, 1999. The disclosures of Ser. Nos. 10/115,665 and 09/246,036 are herein incorporated herein by reference in their entirety.

BACKGROUND OF THE INVENTION

The present invention relates to substrate processing. Specifically, the present invention relates to an apparatus and method for cleaning a processing chamber in a substrate processing system which reduces the time required to complete a dry-clean technique by increasing the flow-rate of cleaning gases therein.

One of the primary steps in the fabrication of modern semiconductor devices is the formation of a layer, such as a metal silicide layer like tungsten silicide ($WSi_x$), on a substrate or wafer. As is well known, such a layer can be deposited by chemical vapor deposition (CVD). In a conventional thermal CVD process, reactive gases are supplied to the substrate surface where heat-induced chemical reactions take place to form the desired film. In a conventional plasma-enhanced CVD (PECVD) process, a controlled plasma is formed using radio frequency (RF) energy or microwave energy to decompose and/or energize reactive species in reactant gases to produce the desired film.

One problem that arises during such CVD processes is that unwanted deposition occurs in the processing chamber and leads to potentially high maintenance costs. With CVD of a desired film on a wafer, undesired film deposition can occur on any hot surface including the heater or process kit parts of the apparatus, because the reactive gases can diffuse everywhere in the processing chamber, even within cracks and around corners. During subsequent wafer depositions, this excess growth on the heater and/or other parts of the apparatus will accelerate until a continuous metal silicide film is grown on the heater and/or these other parts. Over time, failure to clean the residue from the CVD apparatus often results in degraded, unreliable processes and defective wafers. When excess deposition starts to interfere with the CVD system's performance, the heater and other process kit parts (such as the shadow ring and gas distribution faceplate) can be removed and replaced to remove unwanted accumulations in the CVD system. Depending on which and how many parts need replacing and the frequency of the replacement, the cost of maintaining the substrate processing system can become very high.

In these CVD processes, a reactive plasma cleaning is regularly performed to remove the unwanted deposition material from the processing chamber walls, heater, and other process kit parts of the processing chamber. Commonly performed between deposition steps for every wafer or every n wafers, a reactive plasma cleaning procedure that is performed as a standard processing chamber operation where the etching gas is used to remove or etch the unwanted deposited material. One reactive plasma cleaning procedure is performed in situ in the processing chamber promotes excitation and/or disassociation of the reactant gases by the application of RF energy with capacitively coupled electrodes disposed in the processing chamber. The plasma creates a highly reactive species that reacts with and etches away the unwanted deposition material present in the processing chamber.

In addition to such in situ plasma cleaning procedures and occurring far less frequently, a second cleaning procedure involves opening the processing chamber and physically wiping the entire reactor—including the processing chamber walls, exhaust and other areas having accumulated residue—with a special cloth and cleaning liquids. This cleaning procedure is commonly referred to as a wet clean, due to the liquids employed. Failure to periodically wet clean a CVD apparatus results in accumulation of impurities that can migrate onto the wafer and cause device damage. Thus, properly cleaning a CVD apparatus is important for the smooth operation of substrate processing, improved device yield and better product performance. However, the cleaning procedures reduce the availability of a system for manufacture due to the down-time required to complete the procedures.

As an alternative to in situ plasma cleaning, a remote plasma cleaning procedure may be employed. To that end, a processing chamber is connected to a remote microwave plasma system. The remote microwave plasma cleaning procedure reduces the time required to clean the processing chamber. The high breakdown efficiency associated with a microwave plasma provides a higher etch rate (on the order of about 2 μm/min), compared to the etch rate of a capacitive RF plasma.

To further increase the etch rate of unwanted deposition materials, improved reactive plasma generators have been developed which provide an increased flow of reactive radicals into a processing chamber. One such reactive plasma generator is sold under the trademark ASTRON by Applied Science and Technology, Inc. of 35 Cabot Road, Woburn, Mass. 01801-1053. A description of the Astron is located at the following Internet address http://www.astex.com/astron.htm. The Astron is a self-contained atomic fluorine generator which uses a low-field toroidal plasma to dissociate a gas flow introduced into the plasma.

What is needed, however, is a reactive plasma cleaning procedure which further reduces the time required to clean a processing chamber, as compared to the prior art.

BRIEF SUMMARY OF THE INVENTION

The present invention provides a method and apparatus that reduces the time required to clean a processing chamber employing a reactive plasma cleaning technique. Some embodiments of invention do so by employing an Astron fluorine source generator which is in fluid communication with a processing chamber and a supply of fluorine source gas and a supply of inert source gas. In one embodiment, a plasma is formed in the Astron from a flow of substantially pure inert source gas. After formation of the plasma, a flow of a fluorine source gas is introduced therein such that the fluorine source flow accelerates at a rate no greater than 1.67 standard cubic centimeters per second$^2$ ($scc/s^2$). In this fashion, the plasma contains a plurality of radicals and dissociated inert-source gas atoms, defining a cleaning mixture. Forming the plasma in the absence of a fluorine source gas flow overcomes a previously unrecognized problem. Specifically, it was found that flowing a great amount of fluorine source gas into the ASTRON reactive plasma generator would quench the plasma. As a result, the inert-source gas and fluorine source are flowed into the Astron to ensure that the ratio of the former to the latter is greater than 1:1 Specifically, it is believed that the sudden dissociation of the fluorine source gas atoms causes a pressure spike. By slowly accelerating a flow of fluorine source gas into the plasma while ensuring that the aforementioned ratio is satisfied, this problem is overcome.

Furthermore, a maximum etch rate is achieved by ensuring that the ratio of inert source gas to fluorine source gas is greater than 1:1. To that end, flow of the fluorine source introduced into the plasma accelerates until reaching a steady rate which is typically not less than 8.33 scc/s, and the inert source gas is flowed into the Astron reactive plasma generator at a first rate, typically not less than 13.33 scc/s. Preferably, however, the first rate and the steady rate are established so that the ratio of inert-source gas to fluorine source in the cleaning mixture is approximately 3:2. The cleaning mixture is then flowed from the Astron fluorine source generator to the processing chamber where it reacts with undesired contamination present therein. Typically, the fluorine source is selected from a group consisting of $NF_3$, dilute $F_2$, $CF_4$, $C2F_6$, $C_3F_8$, $SF_6$, and $ClF_3$, and the inert-source gas is argon. It is preferred, however, that the fluorine source is $NF_3$.

In another embodiment of the present invention, the acceleration of the fluorine-source gas into the Astron is not critically controlled. Rather, the plasma is formed in the absence of a fluorine-source gas, by flowing the inert source gas into the Astron at a flow rate of approximately 16.67 scc/s. After formation of the plasma, the fluorine source gas is flowed into the Astron at a rate of approximately 13.33 scc/s. After allowing stabilization of the plasma for approximately two to five seconds, the flow rate of both the fluorine source gas and the inert source gas are rapidly increased to 36.67 scc/s and 25.00 scc/s, always ensuring that the ratio of inert-source gas to fluorine source gas is greater than 1:1.

These and other embodiments of the present invention, as well as its advantages and features, are described in more detail in conjunction with the text below and attached figures.

DETAILED DESCRIPTION OF THE INVENTION

I. Exemplary CVD System

Figure 1A:
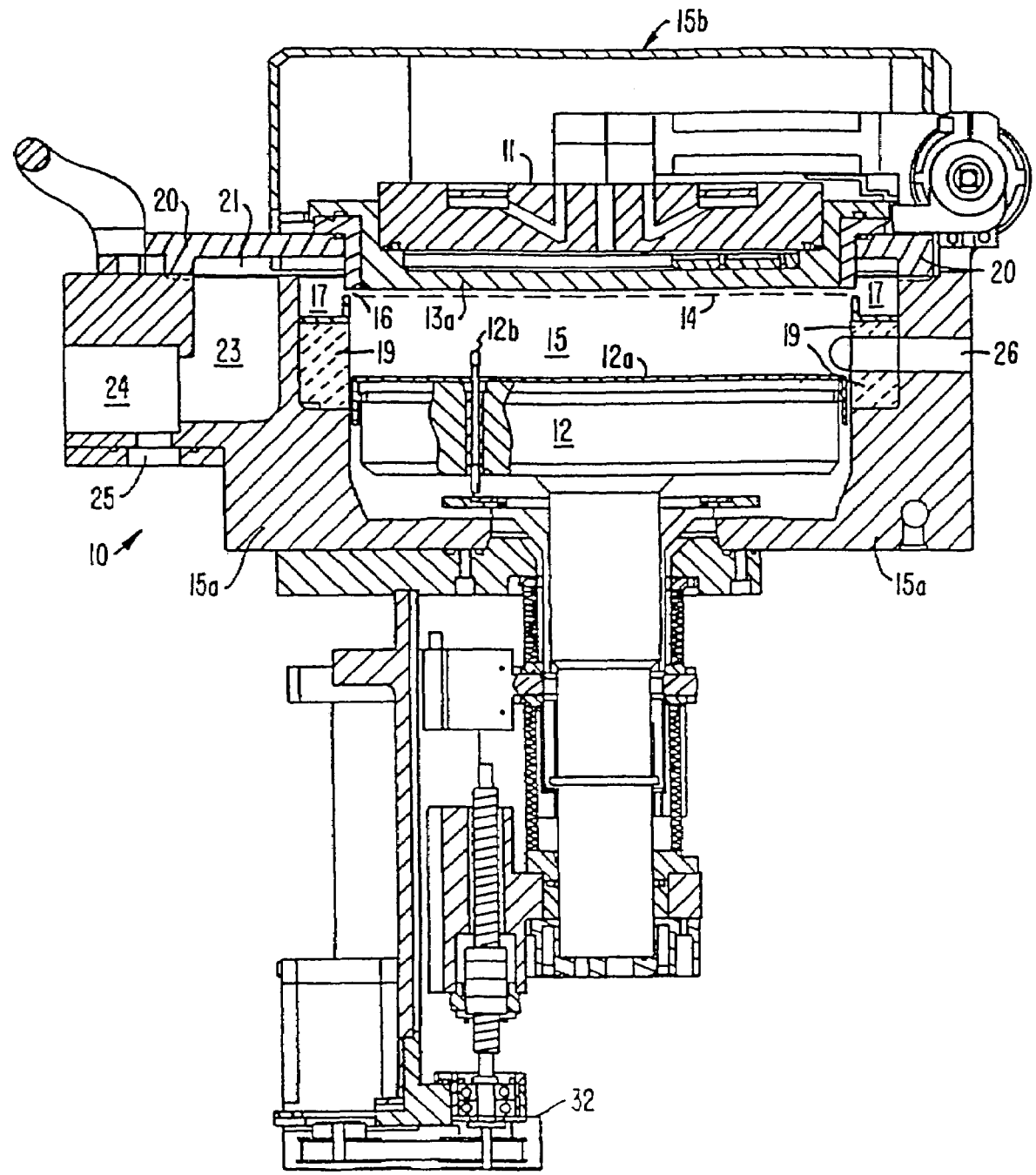
FIGS. 1A and 1B are vertical, cross-sectional views of one embodiment of an exemplary substrate processing apparatus, such as a CVD apparatus, which may be used in accordance with the present invention.
Figure 1B:
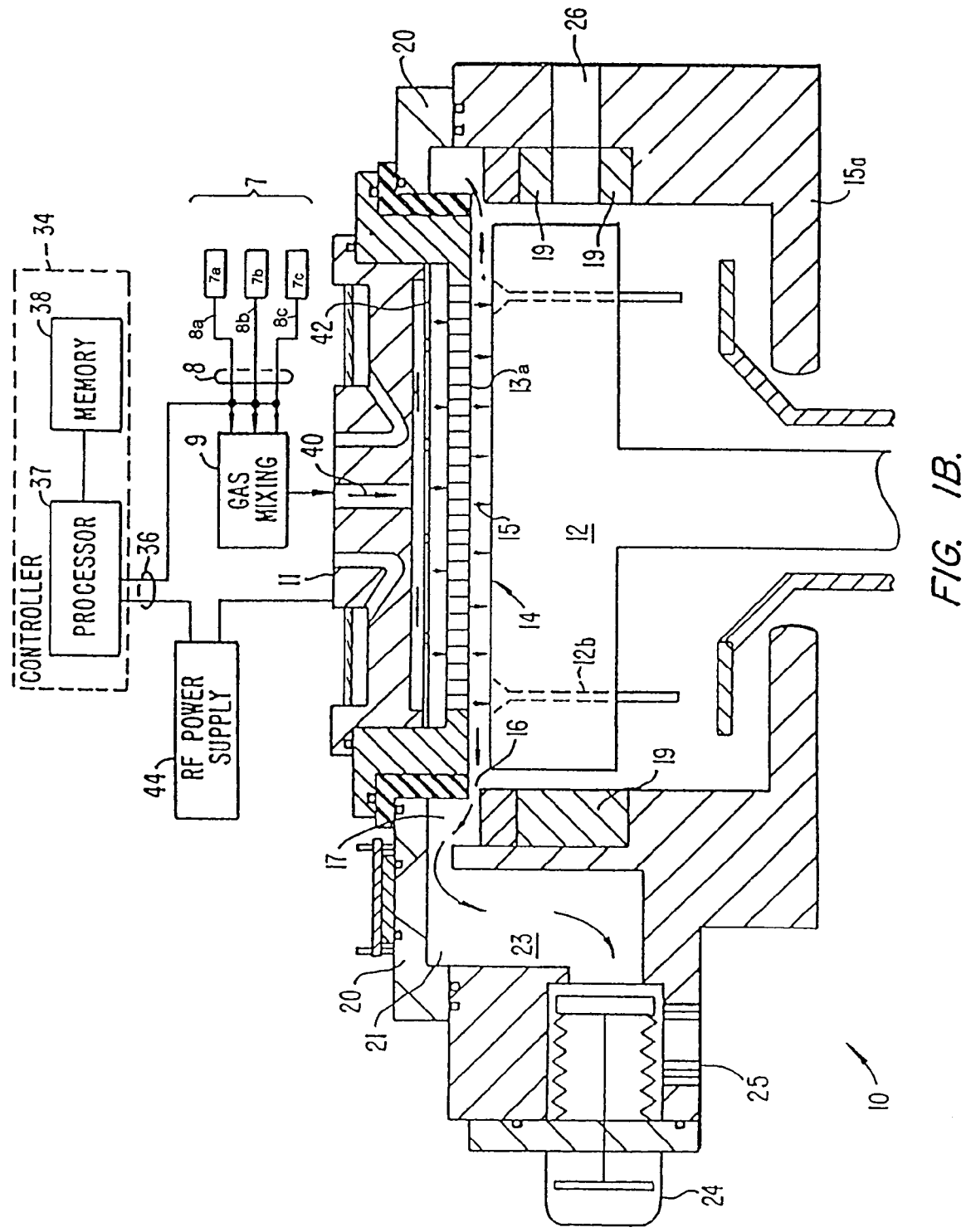
Figure 1C:
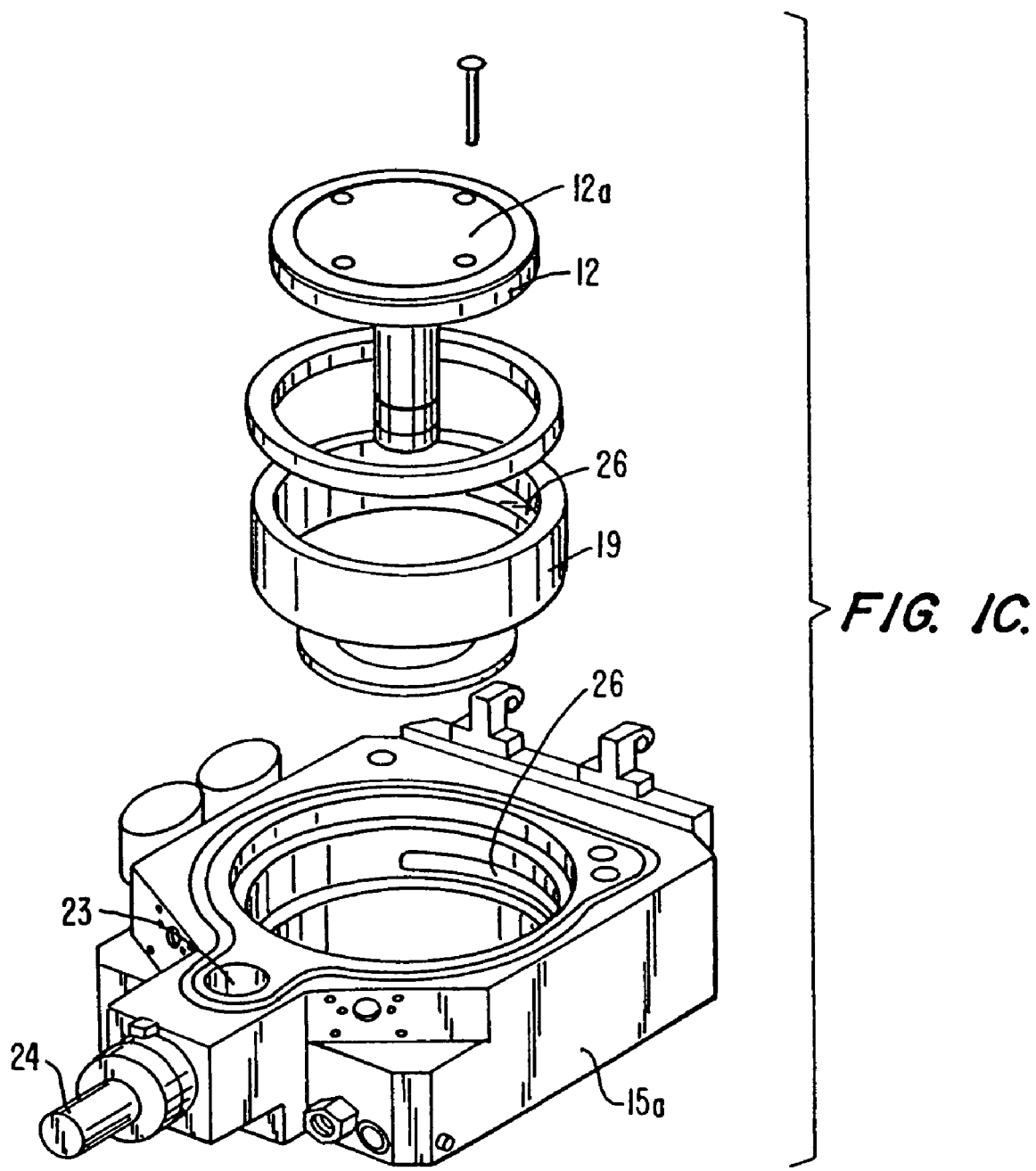
FIGS. 1C and 1D are exploded perspective views of parts of the CVD processing chamber depicted in FIG. 1A.
Figure 1D:
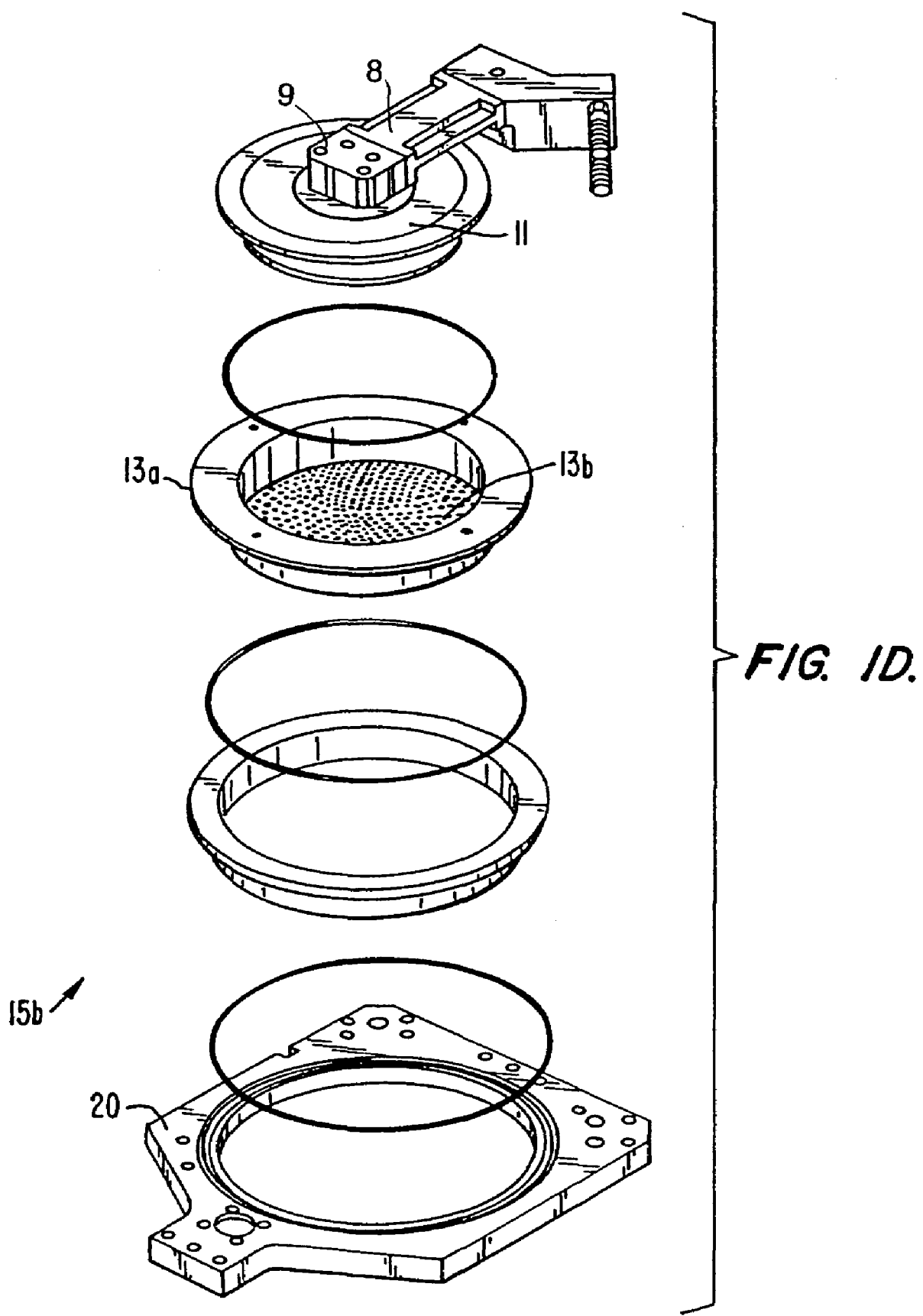

Specific embodiments of the present invention may be used with or retrofitted onto a variety of chemical vapor deposition (CVD) or other types of substrate processing apparatus. One suitable substrate processing apparatus with which the present invention can be used or retrofitted is shown in FIGS. 1A and 1B, which are vertical, cross-sectional views of a CVD system 10, having a vacuum or processing chamber 15 that includes a processing chamber wall 15a and processing chamber lid assembly 15b. Processing chamber wall 15a and processing chamber lid assembly 15b are shown in exploded, perspective views in FIGS. 1C and 1D.

Referring to FIGS. 1A, 1B, 1C and 1D, CVD system 10 contains a gas distribution manifold 11 for dispersing process gases to a substrate (not shown) that rests on a resistively-heated pedestal 12 centered within the processing chamber. During processing, the substrate (e.g., a semiconductor wafer) is positioned on a flat (or slightly convex) surface 12a of pedestal 12. Preferably having a surface of ceramic such as aluminum nitride, pedestal 12 can be moved controllably between a lower loading/off-loading position (depicted in FIG. 1A) and an upper processing position (indicated by dashed line 14 in FIG. 1A and shown in FIG. 1B), which is closely adjacent to manifold 11. A centerboard (not shown) includes sensors for providing information on the position of the wafers.

Deposition and carrier gases are introduced into processing chamber 15 through perforated holes 13b (FIG. 1D) of a conventional flat, circular gas distribution face plate 13a. More specifically, deposition process gases flow (indicated by arrow 40 in FIG. 1B) into the processing chamber through the inlet manifold 11, through a conventional perforated blocker plate 42 and then through holes 13b in gas distribution faceplate 13a.

Before reaching the manifold, deposition and carrier gases are input from gas sources 7 through gas supply lines 8 (FIG. 1B) into a gas mixing block or system 9 where they are combined and then sent to manifold 11. It is also possible, and desirable in some instances, to direct deposition and carrier gases directly from supply lines 8 to manifold 11. In such a case, gas mixing system 9 is bypassed. In other situations, any of gas lines 8 may bypass gas mixing system 9 and introduce gases through passages (not shown) in the bottom of processing chamber 15. As shown in FIG. 1B, there are three gas supply lines 8 in a specific embodiment to deposit, for example, $WSiX_x$, a first line 8a supplies a silicon-containing gas (e.g., dichlorosilane ($SiH_2Cl_2$) referred to as "DCS" from a DCS source from gas source 7a) into gas mixing system 9, while a second line 8b supplies a tungsten-containing gas (e.g., tungsten hexafluoride ($WF_6$) from a $WF_6$ source from gas source 7b) into gas mixing system 9. For each line 8a and 8b, a carrier gas (e.g., argon from argon sources in gas sources 7a and 7b) can be supplied with the process to stabilize gas flows as appropriate and to even the gas flow between the two lines into mixing system 9. Such mixing of gases (DCS and $WF_6$) upstream of processing chamber 15 is believed to result in more uniform gas distribution into the processing chamber, thereby resulting in greater uniformity in the deposited $WSi_x$ film. A third supply line 8c introduces an inert-source purge gas (e.g., argon from a gas source 7c) from the bottom of the processing chamber to keep deposition gases away from the area of the processing chamber below pedestal 12. In some preferred embodiments, an additional silicon source (e.g., silane ($SiH_4$) from source 7a may be supplied to gas line 8a.

Generally, the supply line for each process gas includes (i) several safety shut-off valves (not shown) that can be used to automatically or manually shut off the flow of process gas into the processing chamber, and (ii) mass flow controllers (MFCs) (also not shown) that measure the flow of gas through the supply line. When toxic gases are used in the process, the several safety shut-off valves are positioned on each gas supply line in conventional configurations.

The deposition process performed in the CVD system 10 can be either a thermal process or a plasma-enhanced process. In a plasma-enhanced process, an RF power supply 44 applies electrical power between the gas distribution faceplate 13a and pedestal 12 to excite the process gas mixture to form a plasma within the cylindrical region between the faceplate 13a and pedestal 12. (This region will be referred to herein as the "reaction region"). Constituents of the plasma react to deposit a desired film on the surface of the semiconductor wafer supported on pedestal 12. RF power supply 44 can be a mixed frequency RF power supply that typically supplies power at a high RF frequency (RF1) of 13.56 Megahertz (MHz) and at a low RF frequency (RF2) of 360 kilohertz (kHz) to enhance the decomposition of reactive species introduced into the processing chamber 15. Of course, RF power supply 44 can supply either single- or mixed-frequency RF power (or other desired variations) to manifold 11 to enhance the decomposition of reactive species introduced into processing chamber 15. In a thermal process, RF power supply 44 is not utilized, and the process gas mixture thermally reacts to deposit the desired film on the surface of the semiconductor wafer supported on pedestal 12, which is resistively heated to provide the thermal energy needed for the reaction.

During a plasma-enhanced deposition process, the plasma heats the entire CVD system, including the walls of the processing chamber body 15a surrounding the exhaust passageway 23 and the shut-off valve 24. During a thermal deposition process, heated pedestal 12 causes heating of CVD system. When the plasma is not turned on, or during a thermal deposition process, a hot liquid is circulated through the walls 15a of CVD system to maintain the processing chamber at an elevated temperature. Fluids used to heat the processing chamber walls 15a include the typical fluid types, i.e., water-based ethylene glycol or oil-based thermal transfer fluids. This heating beneficially reduces or eliminates condensation of undesirable reactant products and improves the elimination of volatile products of the process gases and contaminants that might otherwise condense on the walls of cool vacuum passages and migrate back into the processing chamber during periods of no gas flow.

The remainder of the gas mixture that is not deposited in a layer, including reaction products, is evacuated from the processing chamber by a vacuum pump (not shown). Specifically, the gases are exhausted through an annular slot-shaped orifice 16 surrounding the reaction region and into an annular exhaust plenum 17. The annular slot 16 and the plenum 17 are defined by the gap between the top of the processing chamber's cylindrical side wall 15a (including the upper dielectric lining 19 on the wall) and the bottom of the circular processing chamber lid 20. The 360° circular symmetry and uniformity of the slot orifice 16 and the plenum 17 are important to achieving a uniform flow of process gases over the wafer to deposit a uniform film on the wafer.

The gases flow underneath a lateral extension portion 21 of the exhaust plenum 17, past a viewing port (not shown), through a downward-extending gas passage 23, past a vacuum shut-off valve 24 (whose body is integrated with the lower processing chamber wall 15a), and into the exhaust outlet 25 that connects to the external vacuum pump (not shown) through a foreline (also not shown).

The wafer support platter of resistively-heated pedestal 12 is heated using an embedded single-loop heater element configured to make two full turns in the form of parallel concentric circles. An outer portion of the heater element runs adjacent to a perimeter of the support platter, while an inner portion runs on the path of a concentric circle having a smaller radius. The wiring to the heater element passes through the stem of pedestal 12. Pedestal 12 may be made of material including aluminum, ceramic, or some combination thereof.

Typically, any or all of the processing chamber lining, gas inlet manifold faceplate, and various other reactor hardware are made out of material such as aluminum, anodized aluminum, or ceramic. An example of such CVD apparatus is described in commonly assigned U.S. Pat. No. 5,558,717 entitled "CVD Processing Chamber," issued to Zhao et al., hereby incorporated by reference in its entirety.

A lift mechanism and motor 32 (FIG. 1A) raises and lowers the heater pedestal assembly 12 and its wafer lift pins 12b as wafers are transferred by a robot blade (not shown) into and out of the body of the processing chamber through an insertion/removal opening 26 in the side of the processing chamber 10. The motor 32 raises and lowers pedestal 12 between a processing position 14 and a lower wafer-loading position. The motor, valves or flow controllers connected to the supply lines 8, gas delivery system, throttle valve, RF power supply 44, processing chamber and substrate heating systems are all controlled by a system controller 34 (FIG. 1B) over control lines 36, of which only some are shown. Controller 34 relies on feedback from optical sensors to determine the position of movable mechanical assemblies such as the throttle valve and pedestal which are moved by appropriate motors controlled by controller 34.

In a preferred embodiment, the system controller includes a hard disk drive (memory 38), a floppy disk drive and a processor 37. The processor contains a single-board computer (SBC), analog and digital input/output boards, interface boards and stepper motor controller boards. Various parts of CVD system 10 conform to the Versa Modular European (VME) standard which defines board, card cage, and connector dimensions and types. The VME standard also defines the bus structure as having a 16-bit data bus and a 24-bit address bus.

System controller 34 controls all of the activities of the CVD machine. The system controller executes system control software, which is a computer program stored in a computer-readable medium such as a memory 38. Preferably, memory 38 is a hard disk drive, but memory 38 may also be other kinds of memory. The computer program includes sets of instructions that dictate the timing, mixture of gases, chamber pressure, chamber temperature, RF power levels, pedestal position, and other parameters of a particular process. Other computer programs stored on other memory devices including, for example, a floppy disk or other another appropriate drive, may also be used to operate controller 34.

The interface between a user and controller 34 is via a CRT monitor and light pen. In the preferred embodiment two monitors are used, one mounted in the clean room wall for the operators and the other, behind the wall for the service technicians. The monitors simultaneously display the same information, but only one light pen is enabled. A light sensor in the tip of the light pen detects light emitted by CRT display. To select a particular screen or function, the operator touches a designated area of the display screen and pushes the button on the pen. The touched area changes its highlighted color, or a new menu or screen is displayed, confirming communication between the light pen and the display screen. Other devices, such as a keyboard, mouse, or other pointing or communication device, may be used instead of or in addition to the light pen to allow the user to communicate with controller 34.

The process for depositing the film can be implemented using a computer program product that includes computer code to be executed by controller 34. The computer code can be written in any conventional computer readable programming language: for example, 68000 assembly language, C, C++, Pascal, Fortran or others. Suitable program code is entered into a single file, or multiple files, using a conventional text editor and is stored or embodied in a computer-usable medium, such as a memory system of the computer. If the entered computer code is associated with a high level language, the computer code is compiled, and the resultant compiler code is then linked with an object code of precompiled Windows™ library routines. To execute the linked, compiled object code, the system user invokes the object code causing the computer system to load the code in memory. The CPU then reads and executes the code to perform the tasks identified in the program.

Figure 1E:
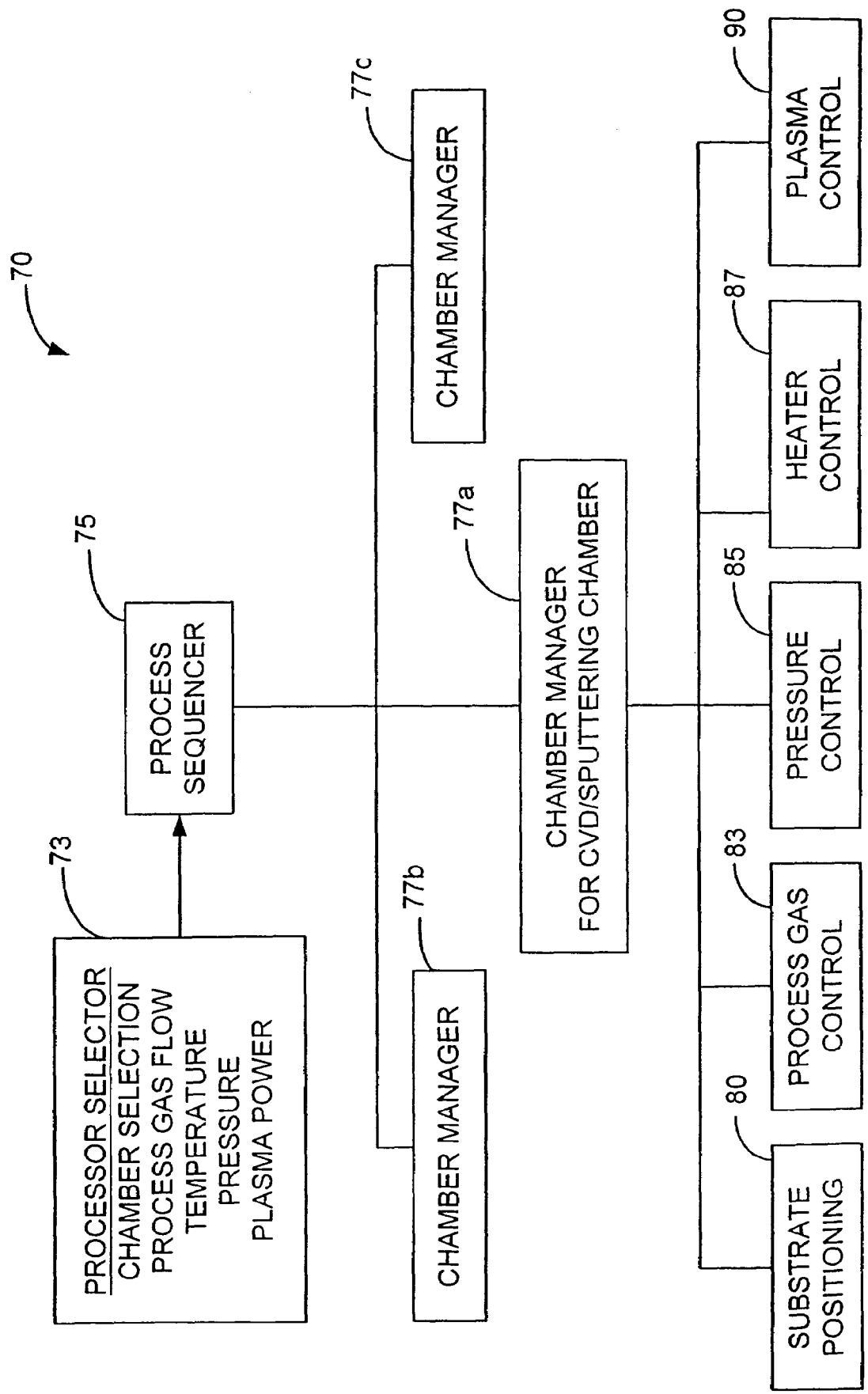
FIG. 1E shows an illustrative block diagram of the hierarchical control structure of the system control software, according to a specific embodiment.

FIG. 1E is an illustrative block diagram of the hierarchical control structure of the system control software, computer program 70, according to a specific embodiment. Using the light pen interface, a user enters a process set number and processing chamber numbers into a process selector subroutine 73 in response to menus or screens displayed on the CRT monitor. The process sets are predetermined sets of process parameters necessary to carry out specified processes, and are identified by predefined set numbers. The process selector subroutine 73 identifies (i) the desired processing chamber and (ii) the desired set of process parameters needed to operate the processing chamber for performing the desired process. The process parameters for performing a specific process relate to process conditions such as process gas composition and flow rates, temperature, pressure, plasma conditions such as microwave power levels or RF power levels and the low frequency RF frequency, cooling gas pressure, and processing chamber wall temperature. These parameters are provided to the user in the form of a recipe and are entered utilizing the light pen/CRT monitor interface.

The signals for monitoring the process are provided by the analog and digital input boards of the system controller, and the signals for controlling the process are output on the analog and digital output boards of CVD system 10.

A process sequencer subroutine 75 comprises program code for accepting the identified processing chamber and set of process parameters from the process selector subroutine 73 and for controlling operation of the various processing chambers. Multiple users can enter process set numbers and processing chamber numbers, or a single user can enter multiple process set numbers and processing chamber numbers, so the sequencer subroutine 75 operates to schedule the selected processes in the desired sequence. Preferably, the sequencer subroutine 75 includes a program code to perform the steps of (i) monitoring the operation of the processing chambers to determine if the processing chambers are being used, (ii) determining what processes are being carried out in the processing chambers being used, and (iii) executing the desired process based on availability of a processing chamber and the type of process to be carried out. Conventional methods of monitoring the processing chambers can be used, such as polling. When scheduling which process is to be executed, sequencer subroutine 75 takes into consideration the present condition of the processing chamber being used in comparison with the desired process conditions for a selected process, or the "age" of each particular user-entered request, or any other relevant factor a system programmer desires to include for determining scheduling priorities.

Once the sequencer subroutine 75 determines which processing chamber and process set combination is going to be executed next, the sequencer subroutine 75 initiates execution of the process set by passing the particular process set parameters to a processing chamber manager subroutine 77*a-c*, which controls multiple processing tasks in a processing chamber 15 according to the process set determined by the sequencer subroutine 75. For example, the processing chamber manager subroutine 77*a* comprises program code for controlling sputtering and CVD process operations in the processing chamber 15. The processing chamber manager subroutine 77 also controls execution of various processing chamber component subroutines that control operation of the processing chamber components necessary to carry out the selected process set. Examples of processing chamber component subroutines are substrate positioning subroutine 80, process gas control subroutine 83, pressure control subroutine 85, heater control subroutine 87, and plasma control subroutine 90. Those having ordinary skill in the art will readily recognize that other processing chamber control subroutines can be included depending on what processes are to be performed in the processing chamber 15. In operation, the processing chamber manager subroutine 77*a* selectively schedules or calls the process component subroutines in accordance with the particular process set being executed. The processing chamber manager subroutine 77*a* schedules the process component subroutines much like the sequencer subroutine 75 schedules which processing chamber 15 and process set are to be executed next. Typically, the processing chamber manager subroutine 77*a* includes steps of monitoring the various processing chamber components, determining which components need to be operated based on the process parameters for the process set to be executed, and causing execution of a processing chamber component subroutine responsive to the monitoring and determining steps.

Operation of particular processing chamber component subroutines will now be described with reference to FIG. 1E. The substrate positioning subroutine 80 comprises program code for controlling processing chamber components that are used to load the substrate onto pedestal 12 and, optionally, to lift the substrate to a desired height in the processing chamber 15 to control the spacing between the substrate and the gas distribution manifold 11. When a substrate is loaded into the processing chamber 15, pedestal 12 is lowered to receive the substrate, and thereafter, pedestal 12 is raised to the desired height in the processing chamber to maintain the substrate at a first distance or spacing from the gas distribution manifold during the CVD process. In operation, the substrate positioning subroutine 80 controls movement of pedestal 12 in response to process set parameters related to the support height that are transferred from the processing chamber manager subroutine 77*a*.

The process gas control subroutine 83 has program code for controlling process gas composition and flow rates. The process gas control subroutine 83 controls the open/close position of the safety shut-off valves, and also ramps the mass flow controllers up or down to obtain the desired gas flow rate. The process gas control subroutine 83 is invoked by the processing chamber manager subroutine 77*a*, as are all processing chamber component subroutines, and receives from the processing chamber manager subroutine process parameters related to the desired gas flow rates. Typically, the process gas control subroutine 83 operates by opening the gas supply lines and repeatedly (i) reading the requisite mass flow controllers, (ii) comparing the readings to the desired flow rates received from the processing chamber manager subroutine 77a, and (iii) adjusting the flow rates of the gas supply lines as necessary. Furthermore, the process gas control subroutine 83 includes steps for monitoring the gas flow rates for unsafe rates and for activating the safety shut-off valves when an unsafe condition is detected.

In some processes, an inert-source gas such as helium or argon is flowed into the processing chamber 15 to stabilize the pressure in the processing chamber before reactive process gases are introduced. For these processes, the process gas control subroutine 83 is programmed to include steps for flowing the inert-source gas into the processing chamber 15 for an amount of time necessary to stabilize the pressure in the processing chamber, and then the steps described above are carried out. Additionally, if a process gas is to be vaporized from a liquid precursor, for example, tetraethylorthosilicate ("TEOS"), the process gas control subroutine 83 is written to include steps for bubbling a delivery gas, such as helium, through the liquid precursor in a bubbler assembly or introducing a carrier gas, such as helium or nitrogen, to a liquid injection system. When a bubbler is used for this type of process, the process gas control subroutine 83 regulates the flow of the delivery gas, the pressure in the bubbler, and the bubbler temperature in order to obtain the desired process gas flow rates. As discussed above, the desired process gas flow rates are transferred to the process gas control subroutine 83 as process parameters. Furthermore, the process gas control subroutine 83 includes steps for obtaining the necessary delivery gas flow rate, bubbler pressure, and bubbler temperature for the desired process gas flow rate by accessing a stored table containing the required values for a given process gas flow rate. Once the required values are obtained, the delivery gas flow rate, bubbler pressure and bubbler temperature are monitored, compared to the required values and adjusted accordingly.

The pressure control subroutine 85 comprises program code for controlling the pressure in the processing chamber 15 by regulating the size of the opening of the throttle valve in the exhaust system of the processing chamber. The size of the opening of the throttle valve is set to control the processing chamber pressure to the desired level in relation to the total process gas flow, size of the processing chamber, and pumping set-point pressure for the exhaust system. When the pressure control subroutine 85 is invoked, the target pressure level is received as a parameter from the processing chamber manager subroutine 77a. The pressure control subroutine 85 measures the pressure in the processing chamber 15 by reading one or more conventional pressure manometers connected to the processing chamber, to compare the measured value(s) to the target pressure, to obtain PID (proportional, integral, and differential) values from a stored pressure table corresponding to the target pressure, and to adjust the throttle valve according to the PID values obtained from the pressure table. Alternatively, the pressure control subroutine 85 can be written to open or close the throttle valve to a particular opening size to regulate the processing chamber 15 to the desired pressure.

The heater control subroutine 87 comprises program code for controlling the current to a heating unit that is used to heat the substrate 20. The heater control subroutine 87 is also invoked by the processing chamber manager subroutine 77a and receives a target, or set-point, temperature parameter. The heater control subroutine 87 measures the temperature by measuring voltage output of a thermocouple located in a pedestal 12, comparing the measured temperature to the set-point temperature, and increasing or decreasing current applied to the heating unit to obtain the set-point temperature. The temperature is obtained from the measured voltage by looking up the corresponding temperature in a stored conversion table or by calculating the temperature using a fourth-order polynomial. When an embedded loop is used to heat pedestal 12, the heater control subroutine 87 gradually controls a ramp up/down of current applied to the loop. Additionally, a built-in fail-safe mode can be included to detect process safety compliance and can shut down operation of the heating unit if the processing chamber 15 is not properly set up.

The plasma control subroutine 90 comprises program code for setting the low and high frequency RF power levels applied to the process electrodes in the processing chamber 15 and for setting the low frequency RF frequency employed. Plasma control subroutine 90 also includes program code for turning on and setting/adjusting the power levels applied to the magnetron or other microwave source used in the present invention. Similarly to the previously described processing chamber component subroutines, the plasma control subroutine 90 is invoked by the processing chamber manager subroutine 77a.

The above CVD system description is mainly for illustrative purposes, and other equipment such as electron cyclotron resonance (ECR) plasma CVD devices, induction coupled RF high density plasma CVD devices, or the like may be used with the present invention to provide upgraded apparatus. Additionally, variations of the above-described system, such as variations in pedestal design, heater design, RF power frequencies, location of RF power connections and others are possible. For example, the wafer could be supported and heated by quartz lamps. It should be recognized that the present invention is not necessarily limited to use with or retrofitting of any specific apparatus.

II. Remote Plasma Cleaning Source

Figure 2:
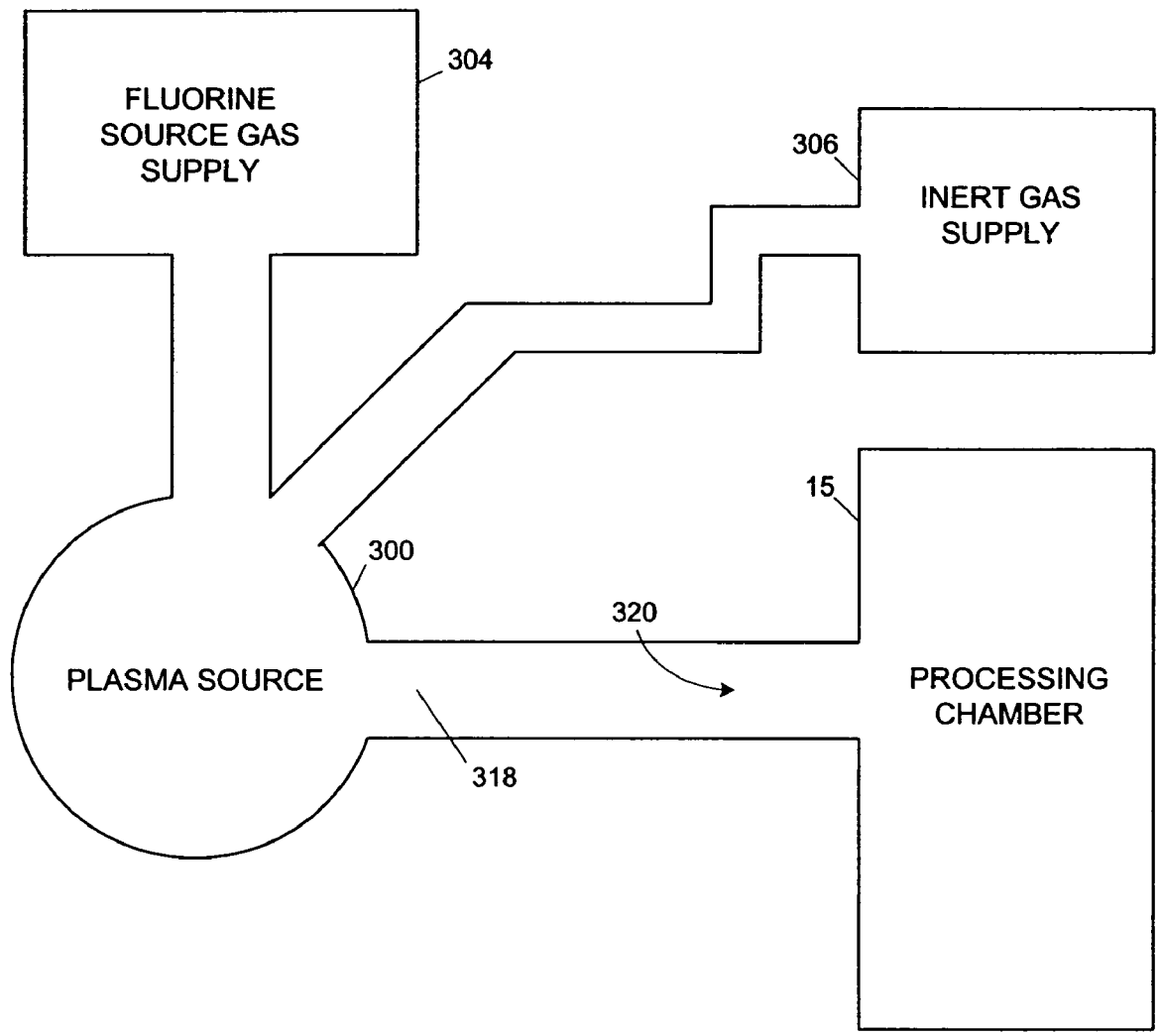
FIG. 2 is a simplified plan view of a remote microwave plasma source cleaning apparatus in accordance with the present invention.

As discussed above, unwanted deposition may occur on any hot surface in the processing chamber 15, including the heater, process kit parts of the apparatus and the processing chamber walls. To remove the unwanted residue, a remote plasma source 300, shown in FIG. 2, is in fluid communication with the processing chamber 15, a supply 304 of a fluorine source gas, such as nitrogen tri-fluoride ($NF_3$), and a supply of a inert-source gas such as argon (Ar) or helium ($He_2$). In this fashion, the fluorine source gas from supply 304 and the inert-source gas from supply 306 may be flowed, under vacuum from the processing chamber's pumping and exhaust system (not shown) into the plasma source 300 where a plasma is formed therefrom. The plasma comprises a plurality of radicals formed from the fluorine source gas and dissociated atoms from the inert-source gas. The aforementioned mixture of radicals and dissociated atoms defines a cleaning mixture. The cleaning mixture flows, under force of vacuum, from the plasma source to the processing chamber 15. Upon entering the processing chamber 15, the fluorine radicals in the cleaning mixture react with the unwanted deposition present in the processing chamber 15. For example, were tungsten silicide present in the processing chamber 15, and the processing chamber 15 and chamber components were manufactured from aluminum, the fluorine radicals would form $WF_6$, $SiF_4$ and $AlF_3$.

In a preferred embodiment, the plasma source 300 is a self-contained atomic fluorine generator which uses a low-field toroidal plasma to dissociate a gas flow introduced into the plasma and is sold by Applied Science and Technology, Inc. of 35 Cabot Road, Woburn, Mass. 01801-1053 under the trademark Astron. The Astron provides a very high flow rate of fluorine radicals into the processing chamber, compared to competing fluorine generators. The flow rate of the fluorine radicals is proportional to the etch rate of unwanted deposition in the processing chamber 15. Therefore, employing the Astron to perform a reactive plasma cleaning procedure substantially reduces the time required to clean the processing chamber 15.

A problem was encountered with the Astron, however, in that rapidly increasing the volume of a fluorine source gas in the Astron quenched the plasma; thus, limiting the time reduction afforded by the Astron. A solution to the aforementioned problem is based upon the discovery that the quenching of the plasma was due to a pressure spike that resulted from flowing the fluorine source gas into the Astron. The pressure spike is attributed to the dissociation of the multi-atom fluorine source into a great number of radicals that are present, for a fraction of a second, upon initiation of the fluorine source into the plasma. It was found that by providing a ratio of the inert-source gas to the fluorine source gas present in the Astron in excess of 1:1, the aforementioned pressure spike is avoided and the plasma is not quenched. To that end, it is preferred that the plasma is formed in the Astron in the absence of a flow of fluorine source gas, i.e., only a flow of inert-source gas is present in the Astron when the plasma is initially formed. Thereafter, a flow of the fluorine source gas is introduced into the Astron and is accelerated at a rate of 1.67 $scc/s^2$, while ensuring that the aforementioned ratio is satisfied. Preferably the flow of fluorine source gas is accelerated until reaching a steady rate, with the rate of the argon and the steady rate of the fluorine source gas being established so that the ratio of inert-source gas to fluorine source gas is 3:2.

Figure 3:
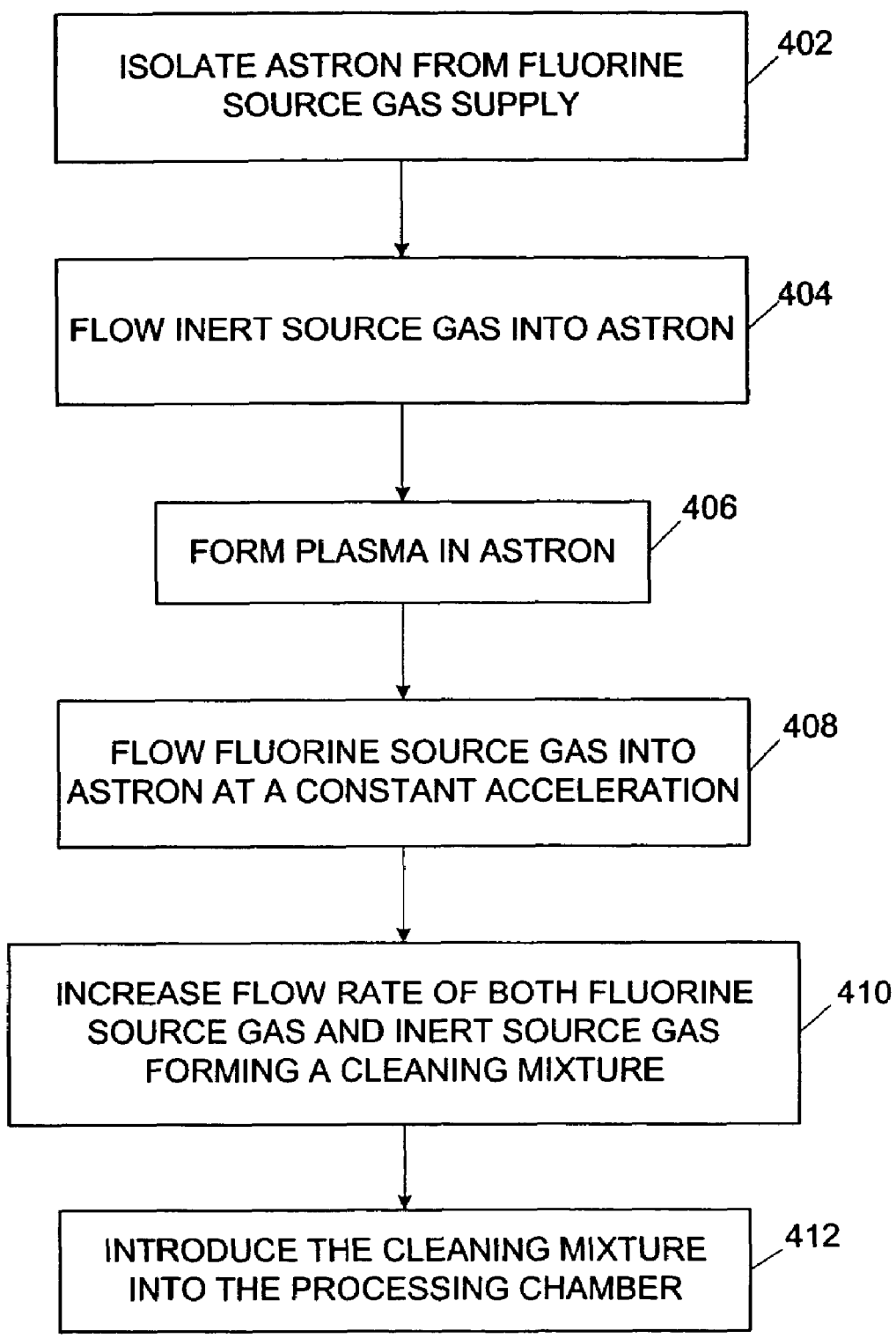
FIG. 3 is a flowchart illustrating the steps for performing a remote microwave plasma cleaning procedure in accordance with the present invention.

Referring to FIG. 3 in an exemplary method of operating the Astron, the Astron is isolated from supply 304 at step 402. At step 404, argon is flowed into the Astron at a rate of 13.33 scc/s. At step 406, a plasma is formed. At step 408 the fluorine source gas is flowed into the Astron so that, in the first second of flow, the rate of the fluorine source gas is 1.67 scc/s and is accelerated at constant rate of 1.67 $scc/s^2$ until reaching a steady rate of 8.33 scc/s at which time the acceleration of the flow is terminated. Thereafter, at step 410 the flow rate of both the inert-source gas and the fluorine source gas into the Astron are increased to approximately 25 scc/s and 15.83 scc/s, respectively. The plasma consisting of 25 scc/s flow rate of inert-source gas and 15.83 scc/s flow rate of fluorine source gas defines a cleaning mixture. At step 412, the cleaning mixture is introduced into the processing chamber 15.

Figure 4:
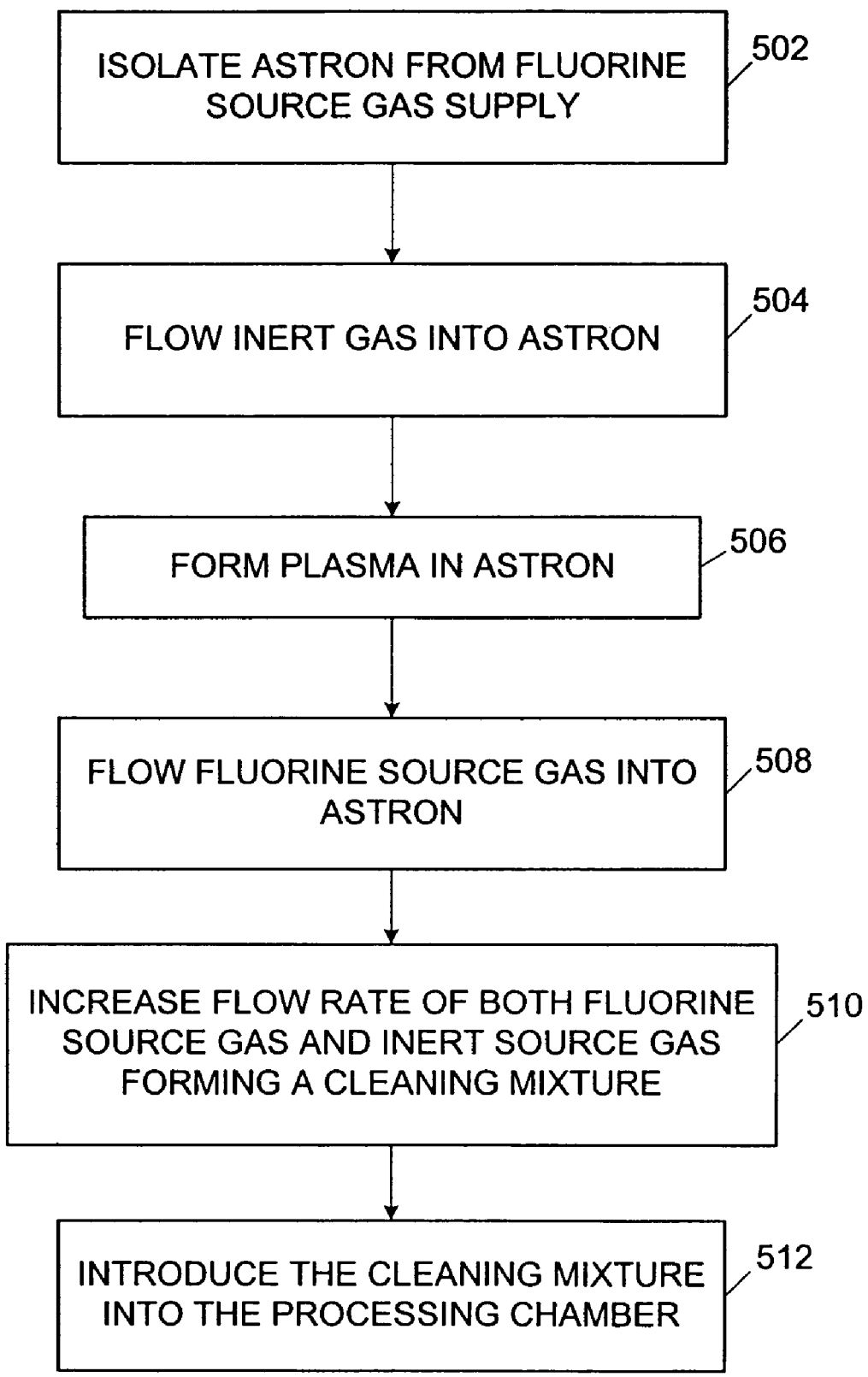
FIG. 4 is a flowchart illustrating the steps for performing a remote microwave plasma cleaning procedure in accordance with another embodiment of the present invention.

Referring to FIG. 4, in another exemplary method according to the present invention, the Astron is isolated from supply 304 at step 502. At step 504, argon is flowed into the Astron at a rate of 16.67 scc/s. At step 506, a plasma is formed. At step 508 the fluorine source gas is flowed into the Astron at a rate of 13.33 scc/s, and after two to five seconds of plasma stabilization the flows of both the fluorine source gas and the inert source gas are rapidly increased, at step 510. Specifically, the fluorine source gas is flowed so that the rate increases to 25.00 scc/s, and the inert source gas is flows so that the rate increases to 36.67 scc/s. However, the ratio of inert-source gas to fluorine source gas is greater than 1:1.

An additional benefit of the present invention concerns the use of argon as the inert-source gas source. Specifically, it was found that by employing the present invention, hazardous air-pollutant sources (HAPS), such as fluorine, are reduced. To determine the quantity of HAPS produced during processing, measurements are made of gases exiting the CVD system 10 via the exhaust passageway 23, shown in FIG. 1A by connecting a HAPS measurement system 100 thereto.

Figure 5:
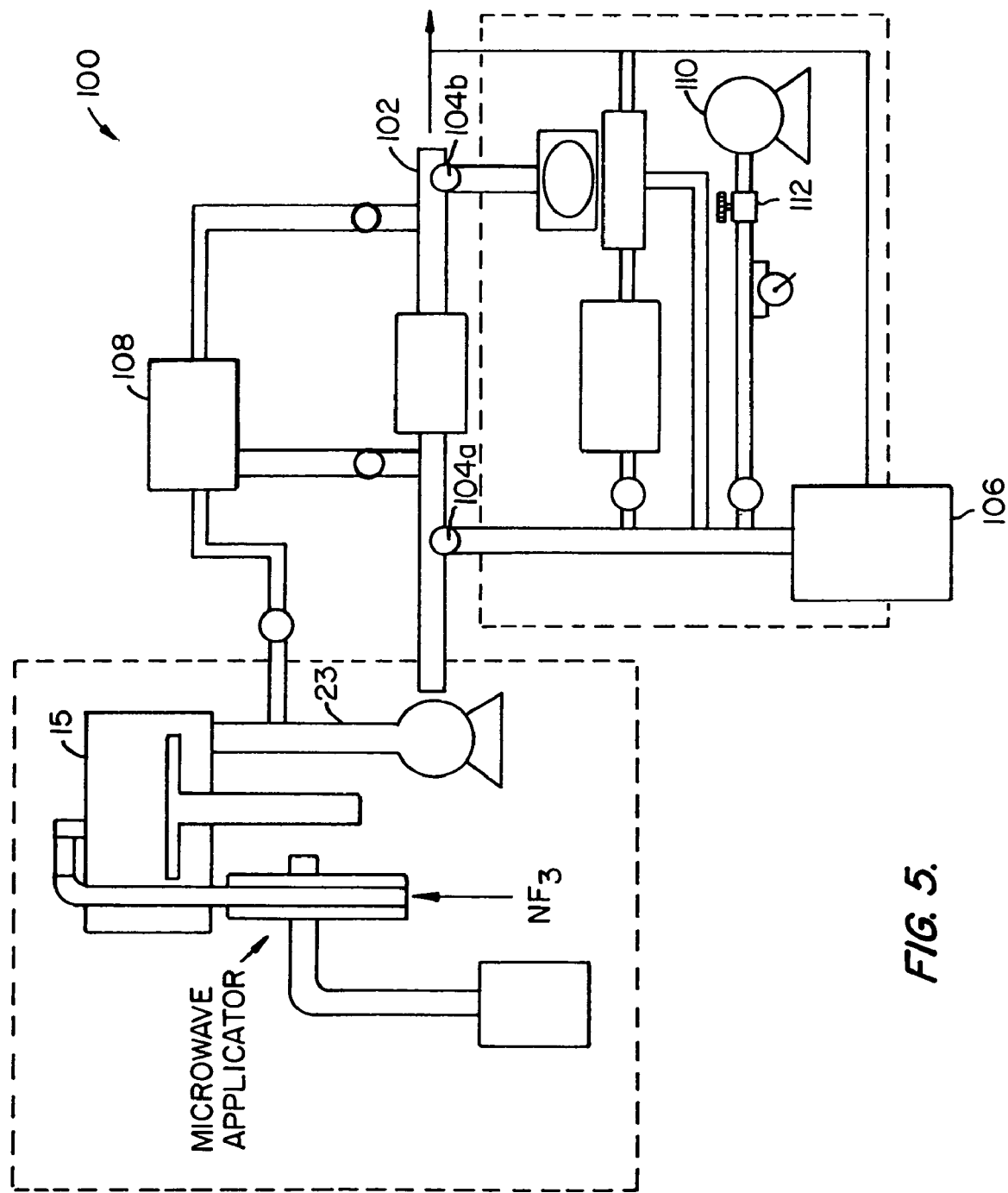
FIG. 5 is a simplified plan view of a hazardous air pollutants (HAPS) measurement system connected to the substrate processing apparatus shown in FIGS. 1A and 1B.

As shown in FIG. 5, the HAPS measurement system 100 includes a sampling cylinder 102, one end of which is connected to the exhaust passageway 23, with the remaining end connected to a building exhaust system (not shown). The sampling cylinder 102 includes two spaced-apart sampling ports 104a and 104b, with a UTI QualiTrace quadrupole mass spectrometer (QMS) system 106 is in fluid communication with the sampling cylinder 102. An abatement system 108 is also in fluid communication with the sampling cylinder 102 and the exhaust passageway 23. The QMS system 106 operates in either a "static" mode to collect a complete spectrum over the entire 200 amu mass range, or a "dynamic" mode to monitor several different ions continuously as a function of time. The instrument is calibrated with a dynamic dilution system to accurately measure gas standards right before each emission measurement to ensure precise quantification of the effluents over a concentration range spanning over five orders of magnitude. The exhaust gas sample is continuously drawn through the exhaust passageway 23 into the QMS system 106 via a pump 110. The pressure in the QMS system 106 is maintained between 650 and 700 Torr via a throttle valve 112. Briefly, $NF_3$ flows through the remote plasma source 300 and decomposes into F and N atoms. The highly reactive F atoms then react with deposition residue, mainly $SiO_2$ to form gaseous effluents, $SiF_4$ and $O_2$.

The second method of investigation utilizes the Fourier transformed infrared (FTIR) absorption spectroscopy to identify the effluent species from the processing chamber 15, qualitatively. The FTIR collects a single infrared interferogram of a static sample instead of monitoring a gas stream continuously over time. After a comparison with the known spectrum of certain gases, the effluent species could be positively identified. This is a helpful for HF measurement, since the HF ion has a similar mass-to-charge ratio as the doubly charged Ar ion. Therefore, FTIR is mainly used as a supplement to the QMS, which has the best resolution and sensitivity.

Figure 6:
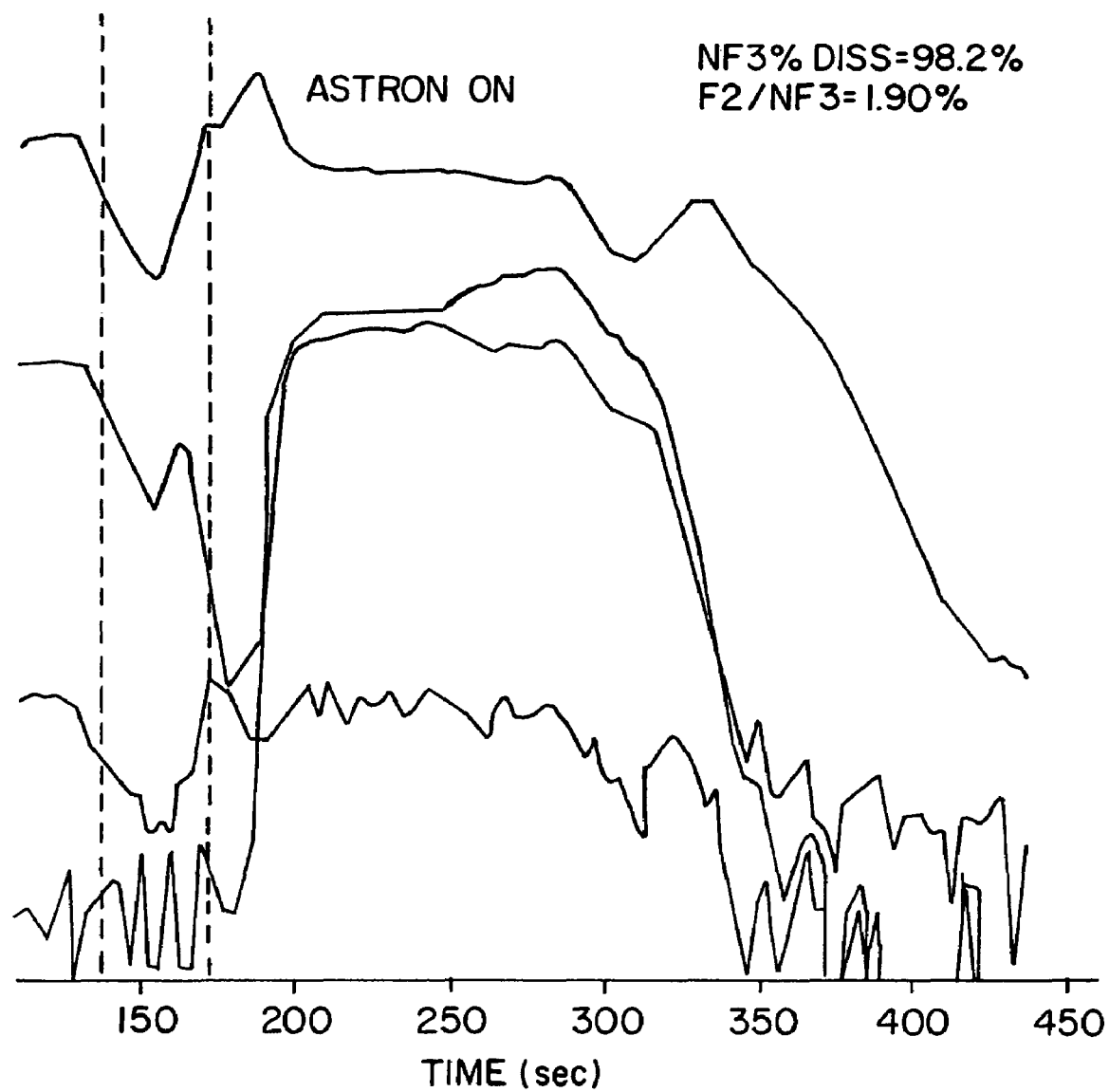
FIG. 6 is a graph showing the make-up of the output gases from a substrate processing apparatus in accordance with the present invention.
Figure 7:
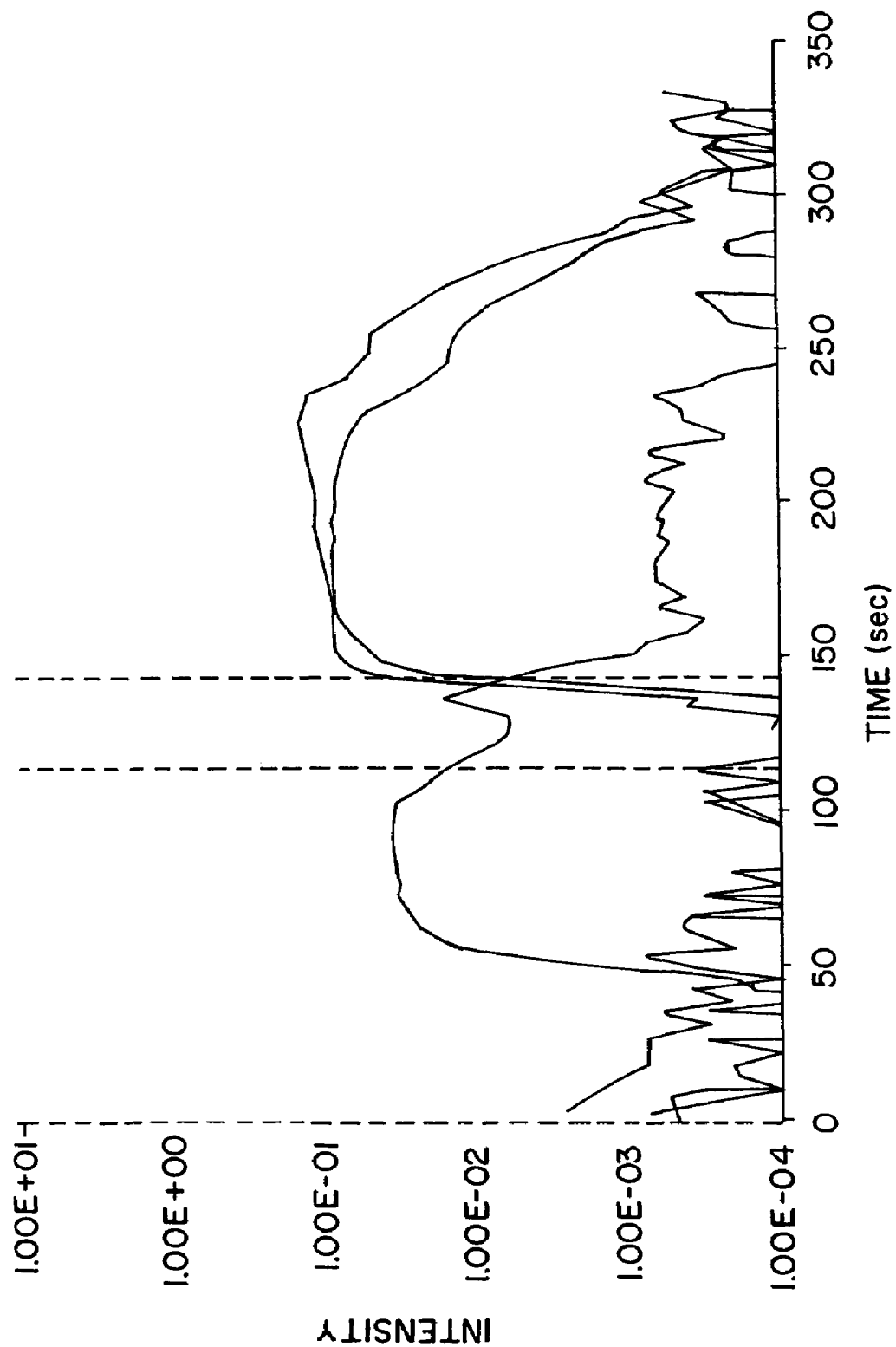
FIG. 7 is a graph showing the make-up of the output gases from a prior art substrate processing apparatus.

Results of the aforementioned measurements are shown in FIGS. 6 and 7. FIG. 6 shows an RGA analysis of gases produced by the present invention and FIG. 7 shows an RGA analysis employing a prior art remote plasma source generator in place of the Astron fluorinator using the system described above. Based on-the aforementioned measurements, it is realized that by employing the Astron fluorinator, the HAPS produced are reduced by 50%.

Although the fluorine source gas is described as being $NF_3$, any one of a variety of fluorine sources may be employed such as dilute $F_2$, $CF_4$, $C_2F_6$, $C_3F_8$, $SF_6$, and $ClF_3$. The scope of the invention should, therefore, be determined not with reference to the above description, but should instead be determined with reference to the appended claims, along with the full scope of equivalents to which such claims are entitled.

What is claimed is:

1. A method of removing residue from a substrate processing chamber, the method comprising:

initiating a plasma within the remote plasma chamber while flowing a first gas consisting of a substantially pure inert gas into a remote plasma chamber;

flowing a nitrogen trifluoride gas into the remote plasma chamber and into the plasma;

creating a plurality of reactive fluorine species in the remote plasma chamber while increasing a rate at which the nitrogen trifluoride gas is introduced into the remote plasma chamber; and introducing the plurality of reactive fluorine species into the substrate processing chamber;

wherein the flow rates of the first gas and nitrogen trifluoride gas introduced into the remote plasma chamber during the method of removing residue are controlled to avoid an abrupt change in pressure within the remote plasma chamber that extinguishes the plasma and wherein a ratio of inert gas to nitrogen trifluoride introduced into the remote plasma chamber is maintained above 1:1 while the rate at which nitrogen trifluoride is introduced is increased.

2. The method of claim 1 wherein the first gas consists of argon.

3. The method of claim 1 wherein the remote plasma generator uses a low-field toroidal to generate the plasma.

4. The method of claim 1 wherein the rate at which the nitrogen trifluoride gas is introduced into the remote plasma chamber is accelerated at a constant rate until reaching a steady state rate and then increased from the steady state rate to a second rate.

5. The method of claim 4 wherein the plurality of reactive fluorine-species are not introduced into the substrate processing chamber until after rate of the nitrogen trifluoride gas reaches the second rate.

6. The method of claim 1 wherein the rate at which the nitrogen trifluoride gas is introduced into the remote plasma chamber is increased from a first rate to a second rate and wherein the plurality of reactive fluorine-species are not introduced into the substrate processing chamber until after the rate of the nitrogen trifluoride gas reaches the second rate.

7. A method of removing residue from a substrate processing chamber, the method comprising:
   providing a remote plasma chamber fluidly coupled to the substrate processing chamber;
   initiating a plasma in the remote plasma chamber from a flow of a substantially pure inert gas;
   forming reactive radicals in the remote plasma chamber from a clean gas introduced into the remote plasma chamber comprising a fluorine-containing gas and an inert gas; and
   transporting the reactive radicals from the remote plasma chamber to the substrate processing chamber while increasing a rate at which the fluorine-containing gas is introduced into the remote plasma chamber;
   wherein the flow rate of gases introduced into the remote plasma chamber during the method of removing residue is controlled to avoid an abrupt change in pressure within the remote plasma chamber that extinguishes the plasma and wherein a ratio of inert gas to fluorine-containing gas in the clean gas is maintained above 1:1 while the rate at which the fluorine-containing gas is introduced into the remote plasma chamber is increased.

8. The method of claim 7 wherein the fluorine-containing gas comprises $NF_3$.

9. The method of claim 7 wherein the fluorine-containing gas comprises $NF_3$.

10. The method of claim 7 wherein the remote plasma generator uses a low-field toroidal to generate the plasma.

11. The method of claim 7 wherein the rate at which the fluorine-containing gas is introduced into the remote plasma chamber is accelerated at a constant rate until reaching a steady state rate and then increased from the steady state rate to a second rate.

12. The method of claim 11 wherein the plurality of reactive fluorine-species are not introduced into the substrate processing chamber until after rate of the fluorine-containing gas reaches the second rate.

13. The method of claim 7 wherein the rate at which the fluorine-containing gas is introduced into the remote plasma chamber is increased from a first rate to a second rate and wherein the plurality of reactive fluorine-species are not introduced into the substrate processing chamber until after rate of the fluorine-containing gas reaches the second rate.

* * * * *